United States Patent
Inoue et al.

(10) Patent No.: US 9,367,076 B2
(45) Date of Patent: Jun. 14, 2016

(54) SEMICONDUCTOR DEVICE

(71) Applicant: Kabushiki Kaisha Toshiba, Minato-ku (JP)

(72) Inventors: Satoshi Inoue, Yokohama (JP); Yuui Shimizu, Kawasaki (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 73 days.

(21) Appl. No.: 14/299,071

(22) Filed: Jun. 9, 2014

(65) Prior Publication Data

US 2015/0261245 A1 Sep. 17, 2015

Related U.S. Application Data (60) Provisional application No. 61/952,476, filed on Mar. 13, 2014.

(51) Int. Cl.
*H01L 21/00* (2006.01)
*G05F 3/02* (2006.01)
*H01L 23/488* (2006.01)

(52) U.S. Cl.
CPC .............. *G05F 3/02* (2013.01); *H01L 23/488* (2013.01); *H01L 2224/16* (2013.01)

(58) Field of Classification Search
CPC ...... G05F 3/02; H01L 23/488; H01L 2224/16
See application file for complete search history.

(56) References Cited

U.S. PATENT DOCUMENTS

| | | | |
|---|---|---|---|
| 7,113,027 B2 * | 9/2006 | Yamazaki et al. | 327/541 |
| 7,839,205 B2 * | 11/2010 | Hirobe | 327/540 |
| 9,019,005 B2 * | 4/2015 | Feldtkeller | 327/543 |
| 2008/0042738 A1 * | 2/2008 | Kang | 327/540 |
| 2008/0290937 A1 * | 11/2008 | Mirow | 330/103 |

\* cited by examiner

*Primary Examiner* — Richard Booth
(74) *Attorney, Agent, or Firm* — Oblon, McClelland, Maier & Neustadt, L.L.P (57) ABSTRACT

A semiconductor device comprises a plurality of semiconductor chips stacked on a substrate. The semiconductor chip comprises: an internal power supply voltage generating circuit that generates an internal power supply voltage based on an external power supply; a power supply line that supplies the internal power supply voltage; an internal power supply pad connected to the power supply line; and a stabilizing capacitance connected to the power supply line. The internal power supply pad is electrically short-circuited with the internal power supply pad included in another semiconductor chip.

16 Claims, 7 Drawing Sheets

SEMICONDUCTOR DEVICE

CROSS REFERENCE TO RELATED APPLICATIONS

This application is based on and claims the benefit of priority from prior U.S. Provisional Patent Application No. 61/952,476, filed on Mar. 13, 2014, the entire contents of which are incorporated herein by reference.

FIELD

Embodiments described below relate to a semiconductor device.

BACKGROUND

In recent years, a further reduction of circuit area is required in a semiconductor device such as a semiconductor memory device. At the same time, the semiconductor memory device is provided with a stabilizing capacitance for suppressing fluctuation of an internal power supply voltage generated inside a circuit. On the other hand, the stabilizing capacitance has a large occupied area and is an obstacle to reduction of circuit area, hence a reduction of the occupied area of the stabilizing capacitance is also required. Under such circumstances, a semiconductor device capable of suppressing fluctuation of the internal power supply voltage while reducing the occupied area of the stabilizing capacitance is desired.

DETAILED DESCRIPTION

A semiconductor device according to an embodiment described below comprises a plurality of semiconductor chips stacked on a substrate. The semiconductor chip comprises: an internal power supply voltage generating circuit that generates an internal power supply voltage based on an external power supply; a power supply line that supplies the internal power supply voltage; an internal power supply pad connected to the power supply line; and a stabilizing capacitance connected to the power supply line. The internal power supply pad is electrically short-circuited with the internal power supply pad included in another semiconductor chip.

Next, a semiconductor device according to embodiments will be described in detail with reference to the drawings.

First Embodiment

First, a semiconductor device according to a first embodiment will be described in detail with reference to FIGS. 1 to 4.

Figure 1:
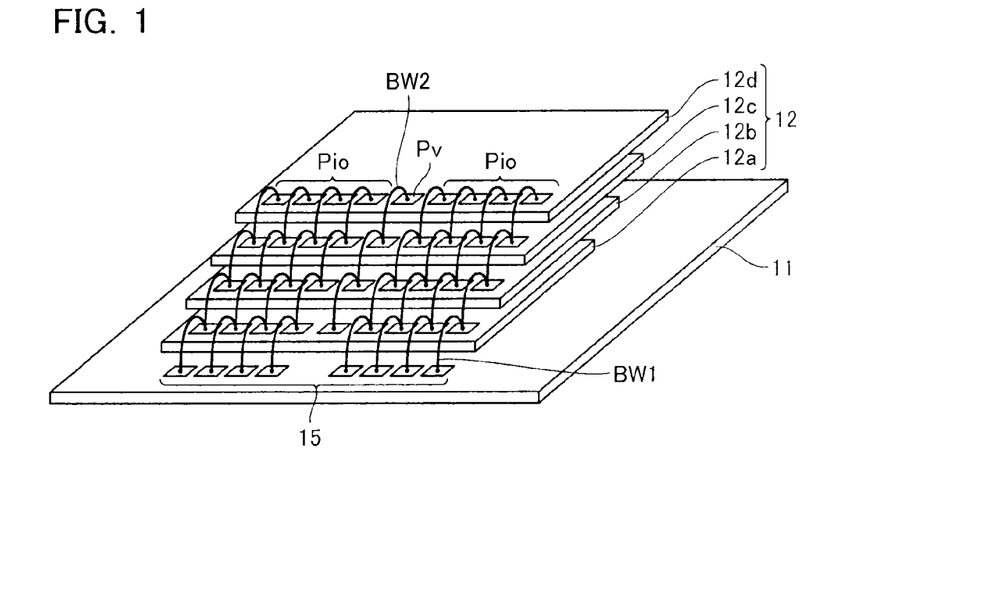
FIG. 1 is a perspective view showing an overall configuration of a semiconductor device of a first embodiment.

As shown in FIG. 1, the semiconductor device of the present embodiment comprises, for example, a package substrate 11, and a plurality of (four in FIG. 1) semiconductor chips 12 (12a to 12d) disposed on this package substrate 11 and stacked in a direction perpendicular to a surface of the package substrate 11. The semiconductor chips 12a to 12d are stacked while being displaced from one another by a certain distance, thereby a pad region thereof being exposed, in order to connect pads thereof by wire bonding.

The package substrate 11 comprises an electrode pad 15 for electrically connecting with an external device. Note that FIG. 1 shows an example where the four semiconductor chips 12a to 12d are all stacked. However, this embodiment is not limited to this example, and it is also possible, for example, that M semiconductor chips among L semiconductor chips are stacked in a certain place and the other N (L=M+N) semiconductor chips are stacked in another place.

In addition, each of the semiconductor chips 12a to 12d comprises a plurality of input/output pads Pio for input/output of data, and an internal power supply pad Pv which is connected to a power supply line that supplies an internal power supply voltage VDD. Data inputted/outputted to/from the input/output pad Pio differs according to a kind of the semiconductor chip 12. As an example, if the semiconductor chip 12 is a NAND type flash memory, then various kinds of commands, an address for designating a memory cell in a memory cell array, or data (write data and read data) are inputted/outputted to/from the input/output pad Pio.

Moreover, the internal power supply pad Pv is connected to the power supply line that outputs a voltage generated by an internal power supply voltage generating circuit which will be described later. Note that although omitted from illustration in FIG. 1, the semiconductor chips 12a to 12d, besides being each provided with these input/output pad Pio and internal power supply pad Pv, may also each be provided with: a control signal-dedicated pad for inputting/outputting various kinds of commands, an enable signal, a chip selection signal, and so on, for controlling the semiconductor chips 12a to 12d; a power supply voltage pad that supplies an external power supply; a ground potential pad that supplies a ground potential; and so on.

Same kinds of input/output pads Pio of the semiconductor chips 12a to 12d are commonly connected to the electrode pad 15 by a bonding wire BW1. Moreover, the internal power supply pads Pv of the semiconductor chips 12a to 12d are also commonly connected by a bonding wire BW2.

Figure 2:
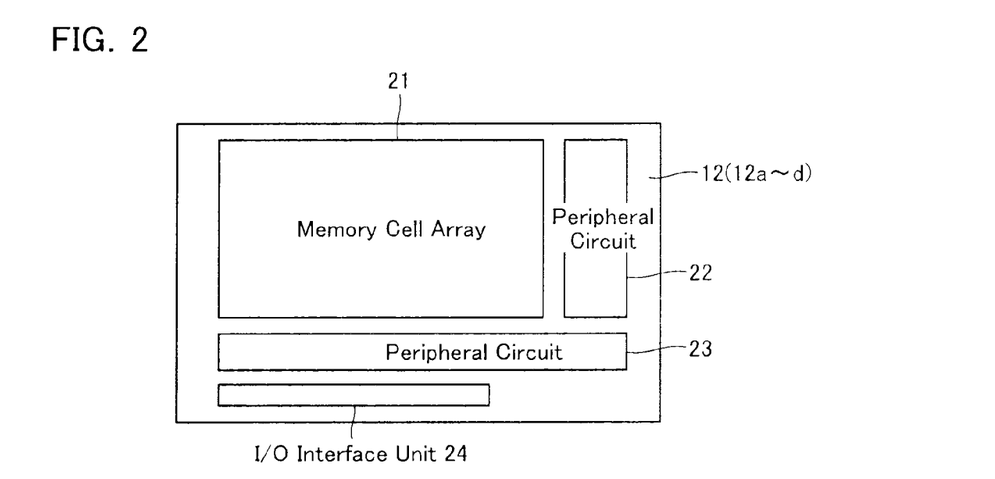
FIG. 2 is a block diagram showing an example of configuration of a semiconductor chip 12 of FIG. 1.

FIG. 2 is a block diagram showing an example of schematic configuration of the semiconductor chip 12. Now, description is made taking as an example the case where the semiconductor chip 12 is a semiconductor memory, for example, a NAND type flash memory. This semiconductor chip 12 comprises, for example, a memory cell array 21 having a plurality of memory cells arranged therein, peripheral circuits 22 and 23 for controlling the memory cell array 21, and an I/O interface unit 24 that handles input/output of data.

Figure 3:
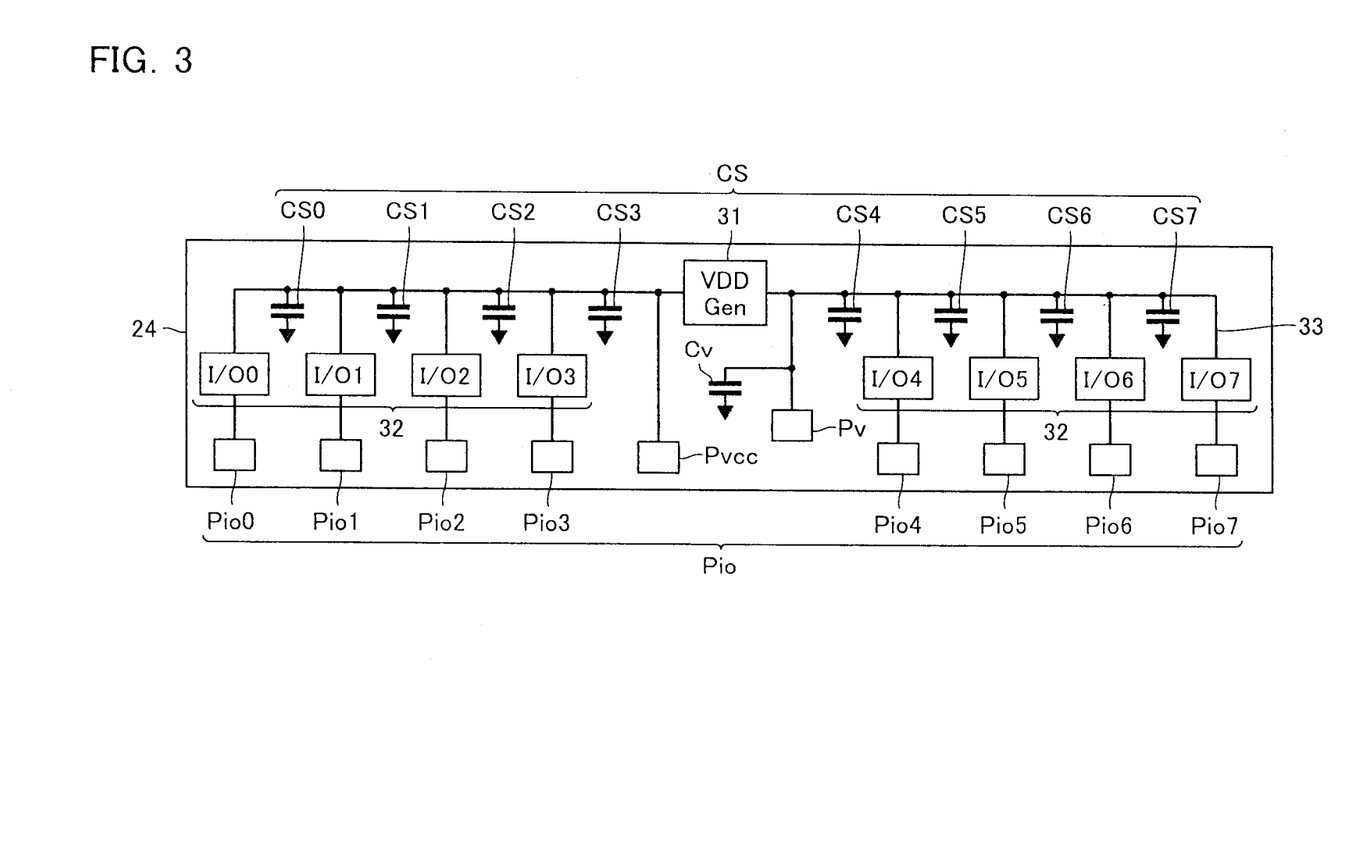
FIG. 3 is a block diagram showing an example of configuration of an I/O interface unit 24 of FIG. 2.

FIG. 3 shows an example of configuration of the I/O interface unit 24. Note that FIG. 3 illustrates only a data inputdedicated input/output pad Pio, the internal power supply pad Pv, and a power supply voltage pad Pvcc that supplies an external power supply. Besides the above-described pads, the I/O interface unit 24 may also comprise an input/output pad for inputting various kinds of commands, an enable signal, a chip selection signal, and so on, although illustration thereof is omitted in FIG. 3.

The I/O interface unit 24 comprises, for example, an internal power supply voltage generating circuit 31, an input/output control circuit 32, a power supply line 33, a stabilizing capacitance CS, the input/output pad Pio, the power supply voltage pad Pvcc, and the internal power supply pad Pv.

The internal power supply voltage generating circuit 31 is a circuit that generates the internal power supply voltage VDD based on an external power supply voltage VCC supplied from the power supply voltage pad Pvcc. This internal power supply voltage VDD is supplied to the input/output control circuit 32 by the power supply line 33. Generally, an I/O interface unit may include two or more internal power supply voltage generating circuits for generating two or more kinds of internal power supply voltages (for example, an internal power supply voltage VDD1 and an internal power supply voltage VDD2 that differ from each other). However, but description here is made assuming that the I/O interface unit 24 includes only one internal power supply voltage generating circuit 31.

The input/output control circuits 32 are provided in one-to-one basis to the input/output pads Pio. The input/output control circuits 32 provide the peripheral circuits 22 and 23 with data inputted from the input/output pads Pio, and function to output data provided from the peripheral circuits 22 and 23 to external.

The internal power supply pad Pv is connected to the power supply line 33 at a closer side to the internal power supply voltage generating circuit 31 (at a base of the power supply line). Specifically, the internal power supply pad Pv is connected to the power supply line 33 at a position further closer to the internal power supply voltage generating circuit 31 than the input/output control circuit 32 among the plural input/output control circuits 32 that is the closest from the internal power supply voltage generating circuit 31 (I/O4). For stabilization of the internal power supply voltage VDD which will be mentioned later, it is preferred that the internal power supply pad Pv is preferentially connected to a portion of the base of the power supply line 33.

In addition, the stabilizing capacitance CS is connected to the power supply line 33. This stabilizing capacitance CS is provided for suppressing fluctuation of the internal power supply voltage VDD and reducing duty, jitter, or skew of an input/output signal inputted/outputted via the I/O interface unit 24. In this example of FIG. 3, a total of eight stabilizing capacitances CS0 to CS7 are provided at a close vicinity to the input/output pads Pio0 to Pio7, corresponding respectively to each of the input/output pads Pio0 to Pio7. However, the stabilizing capacitances CS do not necessarily need to be provided one-to-one to each of the input/output pads Pio, and need only be provided to an extent that enables fluctuation of the internal power supply voltage VDD to be suppressed. Moreover, in this example of FIG. 3, a stabilizing capacitance Cv is connected also to the power supply line 33 at a closer side to the internal power supply pad Pv. However, this stabilizing capacitance Cv may be provided as required similarly to the stabilizing capacitances CS0 to CS7, and in some cases, it may also be omitted. Note that the stabilizing capacitances CS and Cv are preferably configured by a so-called MOS capacitor.

Such a stabilizing capacitance CS is provided to the respective I/O interface unit 24 in each of the semiconductor chips 12a to 12d. However, the stabilizing capacitance CS has a large occupied area and is an obstacle to reduction of circuit area. Therefore, for reduction of circuit area, it is required that area of the stabilizing capacitance CS is reduced. However, there is a risk that if area of the stabilizing capacitance CS is simply reduced, then a problem occurs that fluctuation of the internal power supply voltage VDD becomes large and duty, jitter, and skew of the input/output signal increase.

Figure 4:
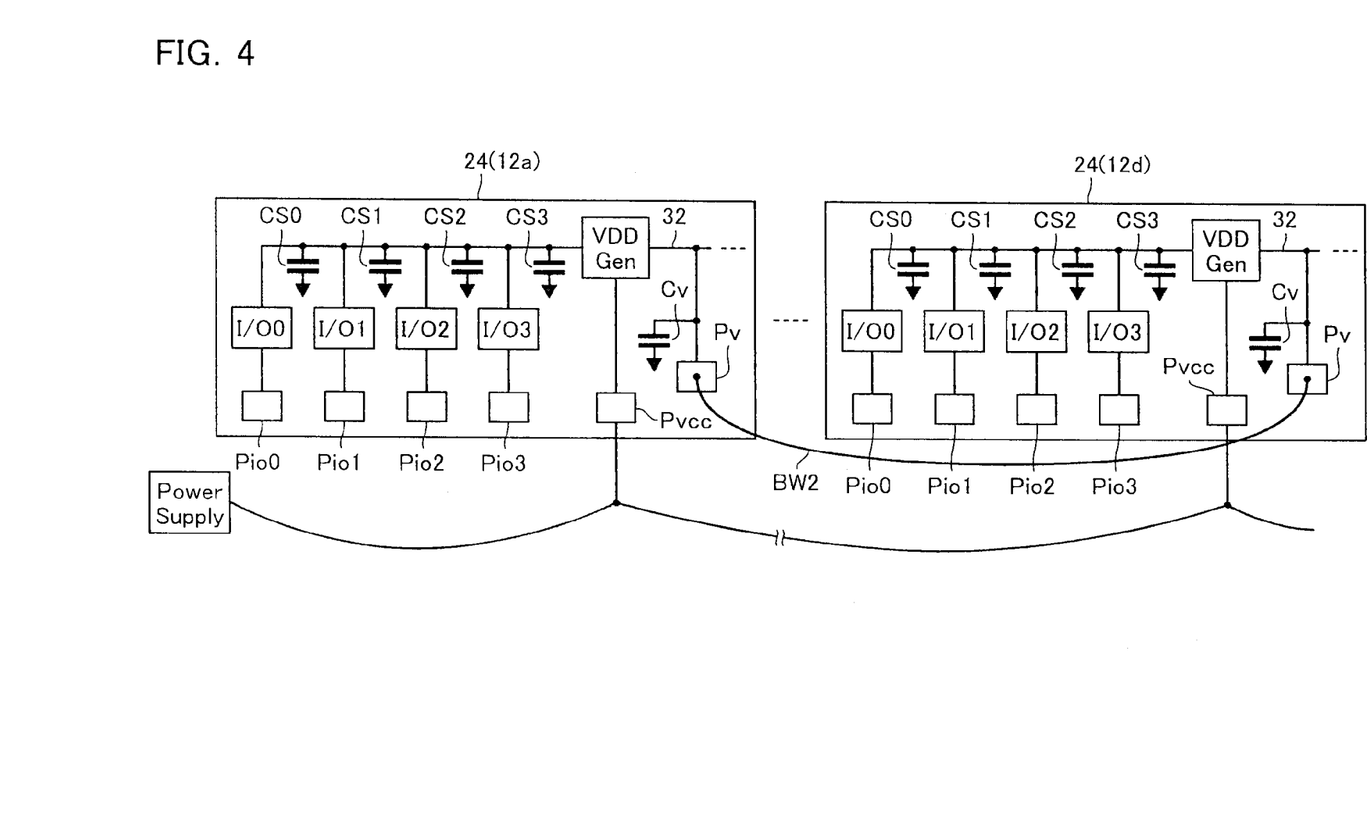
FIG. 4 is a schematic view showing a configuration of the first embodiment.

Accordingly, as shown in FIGS. 1 and 4, the present embodiment adopts a configuration in which a plurality (in this example, four) of the internal power supply pads Pv provided to the semiconductor chips 12a to 12d are electrically short-circuited by the bonding wire BW2 (FIG. 4 illustrates only the input/output interface units 24 of the semiconductor chips 12a and 12d, but the semiconductor chips 12b and 12c are also short-circuited by the identical bonding wire BW2).

Note that there is no need to connect the internal power supply pads Pv of all of the semiconductor chips 12a to 12d by one bonding wire BW2. Identical advantages can be obtained even by connecting several of the internal power supply pads Pv by one bonding wire BW2a while connecting the remaining internal power supply pads Pv by another bonding wire BW2b. Moreover, the internal power supply pads Pv of the semiconductor chips 12a to 12d may be connected by a plurality of the bonding wires BW2 that are in parallel.

In addition, as mentioned above, it is also possible for the I/O interface unit 24 to include two or more internal power supply voltage generating circuits. In this case, the above-described kind of internal power supply pad Pv and bonding wire may be provided to each of the two or more internal power supply voltage generating circuits.

[Advantages]

According to this embodiment, the internal power supply pad Pv is connected to the power supply line 33 to which the internal power supply voltage VDD is supplied, and the internal power supply pads Pv of a plurality of the semiconductor chips 12 are electrically short-circuited by the bonding wire BW2. As a result, even if fluctuation of the internal power supply voltage VDD occurs in one of the semiconductor chips 12a to 12d, for example, the semiconductor chip 12a, this fluctuation can be suppressed by the stabilizing capacitances CS in the other semiconductor chips 12b to 12d. Therefore, the present embodiment allows occupied area of the stabilizing capacitance CS to be reduced compared to a configuration without the bonding wire BW2. As a result, the present embodiment makes it possible to obtain a semiconductor device capable of suppressing fluctuation of the internal power supply voltage while reducing occupied area of the stabilizing capacitance.

Second Embodiment

Next, a semiconductor device according to a second embodiment will be described in detail with reference to FIGS. 5 to 6. Configurative elements identical to those of the first embodiment are assigned with identical reference symbols in FIGS. 5 and 6 to those assigned in FIGS. 1 to 4, and a duplicated description of such configurative elements is omitted below.

Figure 5:
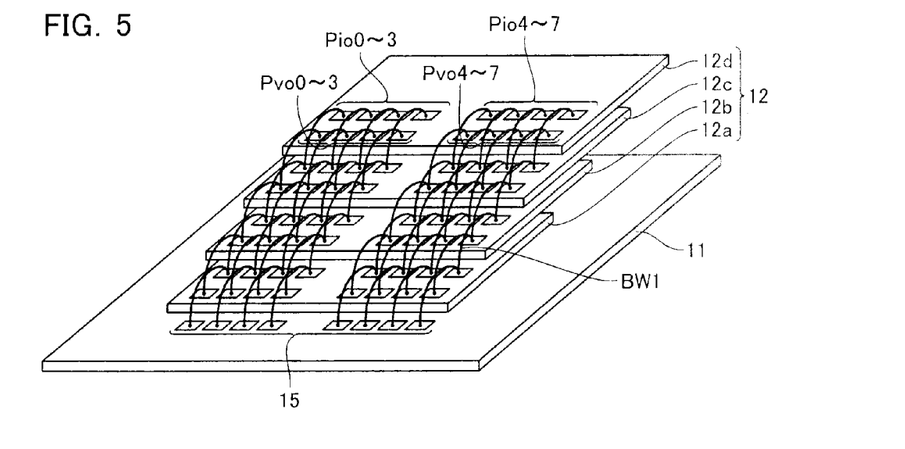
FIG. 5 is a perspective view showing an overall configuration of a semiconductor device of a second embodiment.

FIG. 5 is a perspective view showing an overall configuration of the semiconductor device of the present embodiment. In addition, FIG. 6 is a block diagram showing a structure of an I/O interface unit 24 provided in each of the semiconductor chips 12 of the semiconductor device of the present embodiment. As shown in FIGS. 5 and 6, the semiconductor device of the second embodiment differs from that of the first embodiment in that one I/O interface unit 24 in one semiconductor chip 12 comprises a plurality of internal power supply pads Pv0 to Pv7. The plurality of internal power supply pads Pv0 to Pv7 are each connected to the power supply line 33. Similarly to in the first embodiment, such internal power supply pads Pv0 to Pv7 are short-circuited with the internal power supply pads Pv0 to Pv7 in another semiconductor chip 12 by the bonding wire BW2 (refer to FIG. 5).

In order to suppress fluctuation of the internal power supply voltage VDD, at least one of the plurality of internal power supply pads Pv0 to Pv7, for example, the internal power supply pad Pv4, is connected to the power supply line 33 at a position further closer to the the internal power supply voltage generating circuit 31 than the input/output control circuit 32 among the plural input/output control circuits 32 that is the closest from the internal power supply voltage generating circuit 31 (I/O4). Note that in FIG. 6, any one of stabilizing capacitances Cv0 to Cv7 is connected to each of the plurality of internal power supply pads Pv0 to Pv7, but this is merely one example. The number, disposition, capacitance, and so on, of stabilizing capacitances may be changed variously as required.

In addition, the number of internal power supply pads Pv in one I/O interface unit 24 is not limited to eight. For example, it is also possible that the internal power supply pads Pv are respectively connected to the power supply line 33 at a closer side to the internal power supply voltage generating circuit 31, and to the power supply pads Pv at a position close to its end that is distant from the internal power supply voltage generating circuit 31. According to this, lowering of the internal power supply voltage VDD at an extremity of the power supply line 33 can be suppressed. Note that in order to stabilize the internal power supply voltage VDD, it is preferred that at least one of the internal power supply pads Pv is connected to the power supply line 33 at the base thereof, i.e., at a position closer to an output terminal of the internal power supply voltage generating circuit 31, regardless of the number of internal power supply pads Pv.

Figure 6:
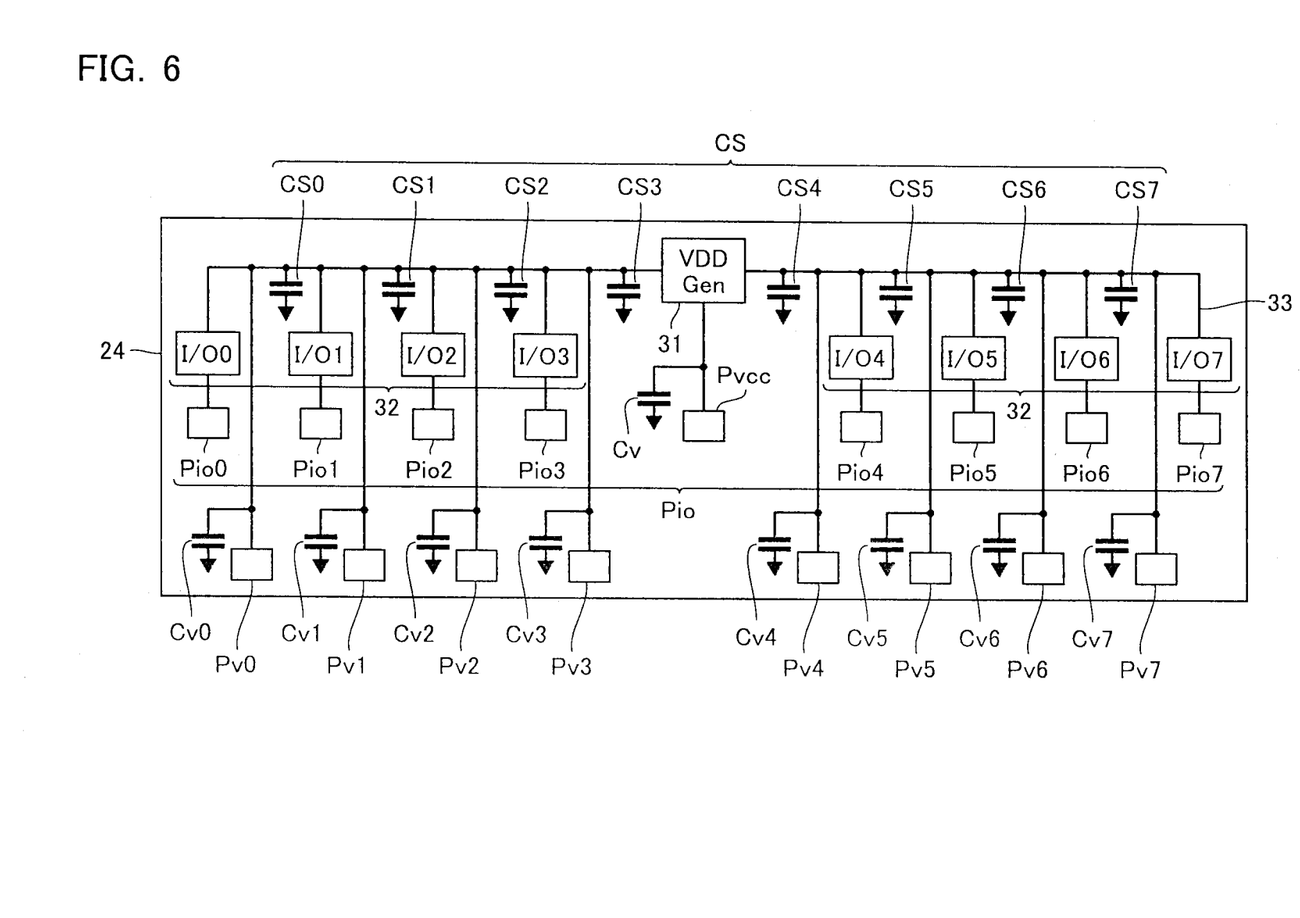
FIG. 6 is a block diagram showing an example of configuration of an I/O interface unit 24 of the semiconductor device of the second embodiment.

Moreover, Although positions of the plurality of internal power supply pads Pv0 to Pv7 are displaced from those of the input/output pads Pio0 to Pio7 in FIG. 6, this is merely one example, and it is possible for these pads to be arranged in an identical column or also possible for the internal power supply pads Pv0 to Pv7 to be disposed closer to the power supply line 33.

In the case of this semiconductor device of the second embodiment, the plurality of internal power supply pads Pv0 to Pv7 are connected to one power supply line 33, hence fluctuation of the internal power supply voltage VDD can be further suppressed compared to in the first embodiment.

Third Embodiment

Figure 7:
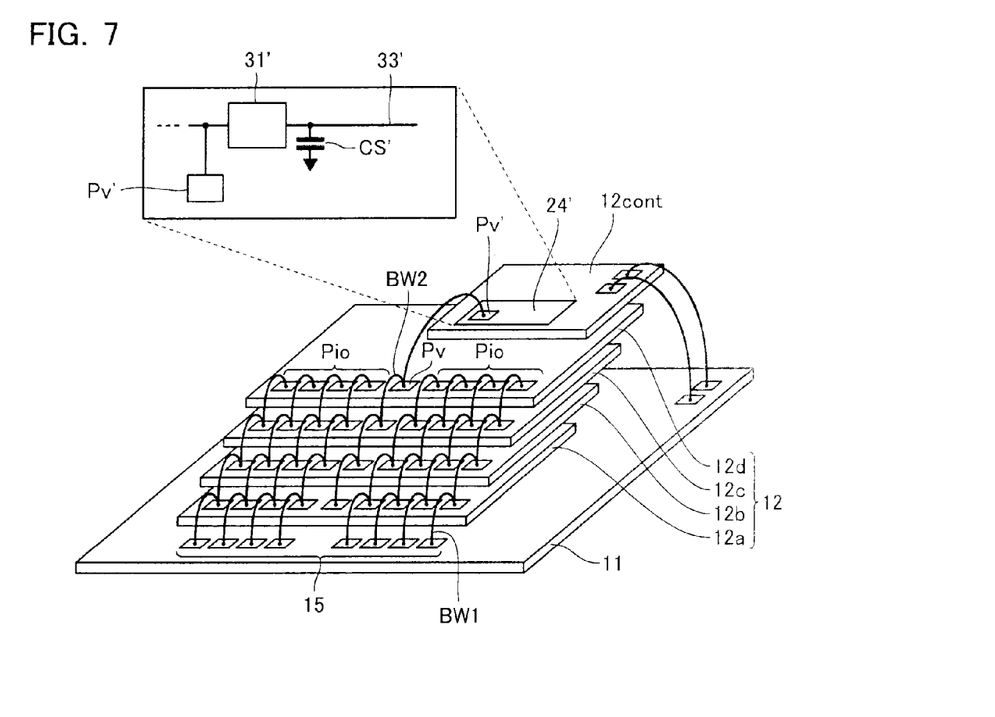
FIG. 7 is a perspective view showing an overall configuration of a semiconductor device of a third embodiment.

Next, a semiconductor device according to a third embodiment will be described in detail with reference to FIG. 7. Configurative elements identical to those of the first embodiment are assigned with identical reference symbols in FIG. 7 to those assigned in FIGS. 1 to 4, and a duplicated description of such configurative elements is omitted below.

This semiconductor device of the third embodiment differs from the previously described embodiments in that not only it has the semiconductor chips 12a to 12d that have a semiconductor memory mounted therein, but also a controller chip 12cont with a controller mounted therein for controlling these semiconductor chips 12a to 12d is stacked on the semiconductor chips 12a to 12d. This controller chip 12cont comprises an internal power supply voltage generating circuit 31' independent of an internal power supply (not illustrated) of the controller chip 12cont and substantially identical to the previously described internal power supply voltage generating circuit 31 of the I/O interface unit 24. In addition, the controller chip 12cont comprises a power supply line 33' and a stabilizing capacitance CS'. Connected to this power supply line 33' is an internal power supply pad Pv'. This internal power supply pad Pv' is electrically short-circuited with the internal power supply pads Pv in the semiconductor chips 12a to 12d by the bonding wire BW2. Note that it is also possible to adopt a configuration including the power supply line 33', the stabilizing capacitance CS', and the internal power supply pad Pv', without disposing the internal power supply voltage generating circuit 31'.

This embodiment enables fluctuation of the internal power supply voltage VDD to be suppressed similarly to in the previously described embodiments. In addition, since the stabilizing capacitance CS' in a controller chip 24' contributes to suppression of fluctuation of the internal power supply voltage VDD in the semiconductor chips 12a to 12d, this embodiment makes it possible to further reduce occupied area of the stabilizing capacitances CS in the semiconductor chips 12a to 12d.

Fourth Embodiment

Figure 8:
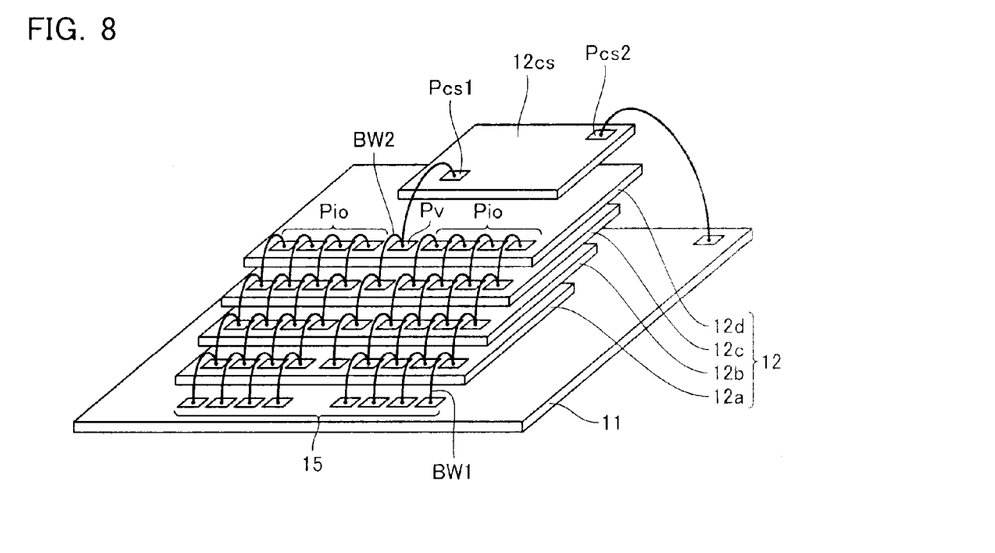
FIG. 8 is a perspective view showing an overall configuration of a semiconductor device of a fourth embodiment.

Next, a semiconductor device according to a fourth embodiment will be described in detail with reference to FIG. 8. Configurative elements identical to those of the first embodiment are assigned with identical reference symbols in FIG. 8 to those assigned in FIGS. 1 to 4, and a duplicated description of such configurative elements is omitted below.

This semiconductor device of the fourth embodiment differs from the previously described embodiments in that not only it has the semiconductor chips 12a to 12d that have a semiconductor memory mounted therein, but also a capacitor chip 12cs that has formed therein a capacitor (capacitive element) such as a MOS capacitor is stacked on the semiconductor chips 12a to 12d. Connected to this capacitor chip 12cs are electrode pads Pcs1 and Pcs2 connected to electrodes of the MOS capacitor, and one of these electrode pads Pcs1 and Pcs2 is electrically short-circuited with the internal power supply pads Pv by the bonding wire BW2. Due to this embodiment, the capacitor in the capacitor chip 12cs has an effect of suppressing fluctuation of the internal power supply voltage VDD along with the previously described stabilizing capacitances CS. Therefore, the present embodiment too can display identical advantages to those of the previously described embodiments.

Figure 9:
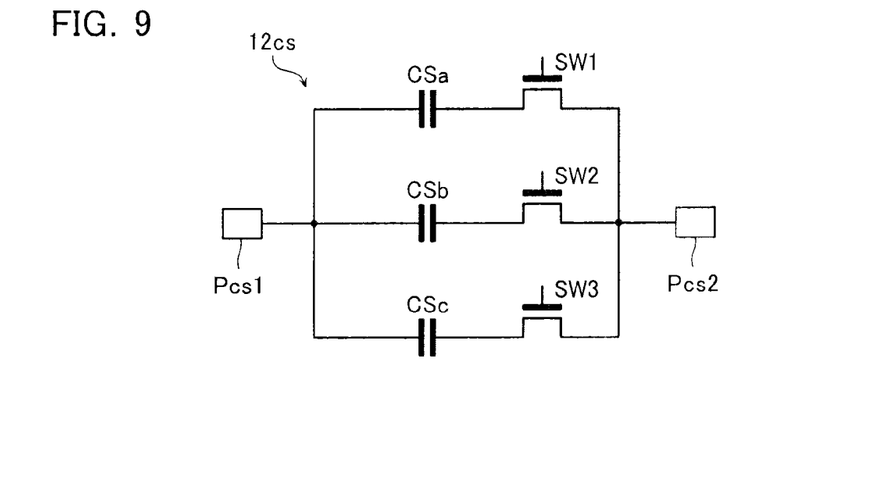
FIG. 9 is a circuit diagram showing a configuration of a capacitor chip 12cs.

Note that the capacitor chip 12cs may comprise configurative elements for selecting an appropriate capacitance. For example, some of a plurality of capacitors CSa, CSb, and CSc connected in parallel as shown in FIG. 9 may be cut by switching elements SW1 to SW3 such as a laser fuse or a transistor, whereby magnitude of the stabilizing capacitance connected to the semiconductor chip is made selectable.

Moreover, the capacitor chip 12cs need not be a capacitor-dedicated chip comprising only a capacitor, and may be, for example, a chip that serves as both a capacitor chip and a controller chip.

Fifth Embodiment

Next, a semiconductor device according to a fifth embodiment will be described in detail with reference to FIG. 10.

This semiconductor device of the fifth embodiment comprises a penetrating electrode (penetrating via) that penetrates the stacked plurality of semiconductor chips 12a to 12d and short-circuits the pads Pio and Pv by this penetrating electrode, thereby differing from the first through fourth embodiments that employ the bonding wires BW1 and BW2.

Figure 10:
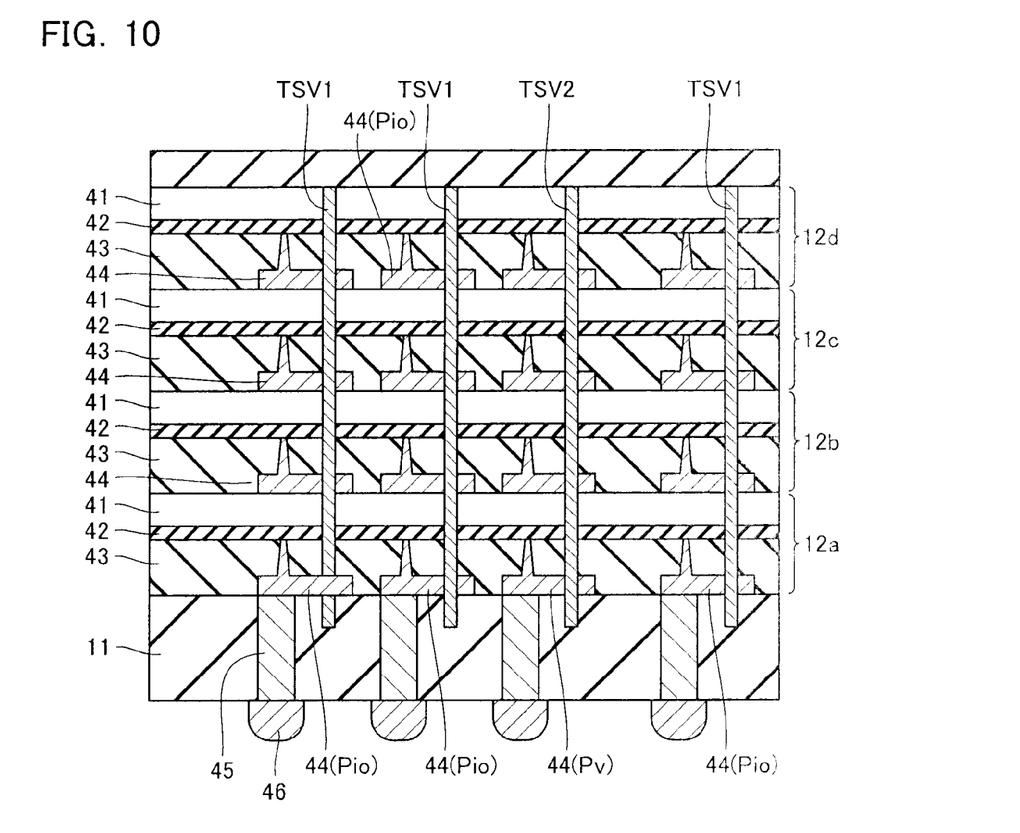
FIG. 10 is a cross-sectional view showing an overall configuration of a semiconductor device of a fifth embodiment.

FIG. 10 is a cross-sectional view showing a structure of the semiconductor device of the fifth embodiment. Semiconductor chips 12a to 12d similar to those of the first through fourth embodiments are stacked on the substrate 11. The substrate 11 has formed therein a via 45 that penetrates from a back surface to a front surface of the substrate 11, and the back surface of the substrate has disposed thereon a bump 46 connected to the plurality of semiconductor chips 12a to 12d via the via 45.

The plurality of semiconductor chips 12a to 12d are stacked on the substrate 11 in a form where ends thereof are substantially aligned. The plurality of semiconductor chips 12a to 12d each include a semiconductor substrate 41, a multi-layer wiring layer 42 that links elements in an identical chip, an insulating layer 43 that covers the multi-layer wiring layer 42, and an electrode pad 44 disposed in the insulating layer 43.

The semiconductor substrate 41 has formed therein, for example, circuits of the kind shown in FIG. 2, similarly to in the first embodiment. The multi-layer wiring layer 42 has formed therein a wiring layer for connecting the various kinds of circuits of the kind shown in FIG. 2. Specifically, the multi-layer wiring layer 42 is configured from a plurality of conductive layers and an inter-layer insulating layer that electrically short-circuits the plurality of conductive layers, although this is not illustrated in the drawings.

Moreover, the electrode pad 44 is buried in the insulating layer 43 and is connected to the multi-layer wiring layer 42 by the penetrating via. The electrode pad 44 includes, for example, the likes of the input/output pads Pio, the power supply voltage pad Pvcc, and the internal power supply pad Pv of the kinds shown in FIGS. 3 and 6. FIG. 10 illustrates only the input/output pads Pio and the internal power supply pad Pv.

In addition, same kinds of input/output pads Pio are electrically short-circuited by a penetrating electrode TSV1 that penetrates the semiconductor chips 12a to 12d. This penetrating electrode TSV1 has a similar action to that of the bonding wire BW1 of the first through fourth embodiments.

Moreover, the internal power supply pads Pv in the semiconductor chips 12a to 12d are electrically short-circuited by a penetrating electrode TSV2. This penetrating electrode TSV2 has a similar action to that of the bonding wire BW2 of the first through fourth embodiments.

Note that a configuration employing these penetrating electrodes TSV1 and TSV2 may of course be adopted not only in the semiconductor device of the first embodiment, but also in the other embodiments. Moreover, in the example of FIG. 10, the penetrating electrodes TSV1 and TSV2 are electrically connected with external via the via 45 and the bump 46, but instead it is also possible to adopt a configuration electrically connecting with external by, for example, a bonding wire connected to a top of the penetrating electrodes TSV1 and TSV2.

This embodiment also can display identical advantages to those of the first through fourth embodiments that employ the bonding wires BW1 and BW2.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-described embodiments, the internal power supply pads Pv are electrically short-circuited by the bonding wire or the penetrating electrode (penetrating via), but any form may be adopted for the conductive material for short-circuiting. Moreover, it is also possible for the bonding wire and the penetrating electrode to co-exist in one device.

Furthermore, the above-described embodiments show examples where the stabilizing capacitance CS included in the I/O interface unit 24 in a certain semiconductor chip 12 is utilized as the stabilizing capacitance of the other semiconductor chips 12. However, it is also possible for a capacitor other than the stabilizing capacitance to be connected to the power supply line 33 and thereby achieve a reduction of the stabilizing capacitance.

What is claimed is:

1. A semiconductor device, comprising a plurality of semiconductor chips disposed on a substrate,
   one of the semiconductor chips comprising:
   an internal power supply voltage generating circuit that generates an internal power supply voltage based on an external power supply;
   a power supply line that supplies the internal power supply voltage;
   an internal power supply pad connected to the power supply line; and
   a stabilizing capacitance connected to the power supply line, and
   the internal power supply pad being electrically short-circuited with the internal power supply pad included in another semiconductor chip.

2. The semiconductor device according to claim 1, wherein the internal power supply pad is connected to the internal power supply pad included in the other semiconductor chip by a bonding wire.

3. The semiconductor device according to claim 1, wherein the internal power supply pad is connected to the internal power supply pad included in the other semiconductor chip by a penetrating electrode that penetrates the plurality of semiconductor chips.

4. The semiconductor device according to claim 1, wherein a plurality of the internal power supply pads are connected to the power supply line.

5. The semiconductor device according to claim 1, further comprising a plurality of input/output pads, and a plurality of input/output control circuits that are respectively connected to the plurality of input/output pads and control input or output of a signal,
   wherein the power supply line is connected between the input/output control circuit and the internal power supply voltage generating circuit, and supplies the internal power supply voltage to the input/output control circuit.

6. The semiconductor device according to claim 5, wherein the internal power supply pad is connected to the internal power supply pad included in the other semiconductor chip by a bonding wire.

7. The semiconductor device according to claim 5, wherein the internal power supply pad is connected to the internal power supply pad included in the other semiconductor chip by a penetrating electrode that penetrates the plurality of semiconductor chips.

8. The semiconductor device according to claim 5, wherein at least the internal power supply pad is connected to the power supply line at a position further closer to the internal power supply voltage generating circuit than an input/output control circuit among the plural input/output control circuits that is the closest from the internal power supply voltage generating circuit.

9. The semiconductor device according to claim 5, wherein a plurality of the internal power supply pads are connected to the power supply line.

10. The semiconductor device according to claim 9, wherein
at least one of a plurality of the internal power supply pads is connected to the power supply line at a position further closer to the internal power supply voltage generating circuit than an input/output control circuit among the plural input/output control circuits that is the closest from the internal power supply voltage generating circuit.

11. The semiconductor device according to claim 1, wherein
the semiconductor chip includes a first semiconductor chip having mounted thereon a semiconductor memory, and a second semiconductor chip having mounted thereon a controller for controlling the first semiconductor chip.

12. The semiconductor device according to claim 11, wherein
the internal power supply pad is connected to the internal power supply pad included in another first semiconductor chip or second semiconductor chip by a bonding wire.

13. The semiconductor device according to claim 11, wherein
the internal power supply pad is connected to the internal power supply pad included in another first semiconductor chip or second semiconductor chip by a penetrating electrode that penetrates the plurality of semiconductor chips.

14. The semiconductor device according to claim 1, further comprising a capacitor chip having mounted thereon a capacitor,
wherein a terminal of the capacitor is electrically connected to the internal power supply pad.

15. The semiconductor device according to claim 14, wherein
the internal power supply pad is connected to the internal power supply pad included in another semiconductor chip and capacitor chip by the bonding wire.

16. The semiconductor device according to claim 14, wherein
the internal power supply pad is connected to the internal power supply pad included in another semiconductor chip and capacitor chip by a penetrating electrode that penetrates the plurality of semiconductor chips.

* * * * *